(12) United States Patent
Finnie et al.

(10) Patent No.: US 6,808,993 B2
(45) Date of Patent: Oct. 26, 2004

(54) ULTRA-THIN GATE DIELECTRICS

(75) Inventors: Christine M. Finnie, Beaverton, OR (US); Pauline N. Jacob, Portland, OR (US); Nick Lindert, Hillsboro, OR (US); Keith M. Jackson, Portland, OR (US); Kirk Althoff, North Plains, OR (US); Jack Hwang, Portland, OR (US); Jack Kavalieros, Portland, OR (US); James R. Mueller, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/339,783

(22) Filed: Jan. 8, 2003

(65) Prior Publication Data

US 2004/0132316 A1 Jul. 8, 2004

(51) Int. Cl.$^7$ .............................................. H01L 21/336
(52) U.S. Cl. ...................... 438/287; 438/761; 438/763; 438/774; 438/775; 438/786; 438/787
(58) Field of Search ........................ 438/287, 761–763, 438/774–775, 786–788, 791

(56) References Cited

U.S. PATENT DOCUMENTS

| | | | |
|---|---|---|---|
| 6,124,171 A | | 9/2000 | Arghavani et al. |
| 6,239,044 B1 | * | 5/2001 | Kashiwagi et al. ......... 438/787 |
| 6,265,297 B1 | * | 7/2001 | Powell ....................... 438/592 |
| 6,670,242 B1 | * | 12/2003 | Brady et al. ................ 438/261 |

OTHER PUBLICATIONS

Peters, Laura, "Thermal Processing's Tool of Choice: Single–Wafer RTP or Fast Ramp Batch?" Semiconductor International, Jan. 1, 1998, 6 pgs.
"Promecon (TM) 1000 [vertical furnace installation], " Sizary Products, http://www.sizary.com/products_P1000_vert.htm, Jul. 25, 2001, 3 pgs.

* cited by examiner

Primary Examiner—Hsien Ming Lee
(74) Attorney, Agent, or Firm—Schwabe, Williamson & Wyatt, P.C.

(57) ABSTRACT

An in-situ ultra dilute ammonia nitridation process and apparatus of the following ultra-thin chemically tailored gate dielectrics: DCE/$O_2$ (Trans 1,2-Dichloroethylene) based ultra-thin gate dielectric; Nitric Oxide (NO) based ultra-thin gate dielectric that has been re-oxidized via a DCE/$O_2$ (Trans 1,2-Dichloroethylene) process; "dry-wet" DCE (Trans 1,2-Dichloroethylene)/O2-H2O/O2) based ultra-thin gate dielectric; and ultra dilute, less than 1E-7 moles $NH_3$/mm$^2$, nitridation of an ultra-thin gate dielectric. A vertical diffusion furnace (VDF) is provided to process the same. The ultra-thin chemically tailored gate dielectrics generated in a VDF with ultra-dilute $NH_3$, below 1E-7 moles $NH_3$/mm$^2$, in-situ nitridation show a performance comparable or better to traditional ex-situ rapid thermal anneal (RTA) processing techniques for 90 nm CMOS technology. These methods replace and remove at least one process layer in the fabrication of CMOS devices using traditional ex-situ RTA processing, decreasing production costs, and improving fabrication cycle time, with equivalent or improved transistor performance.

22 Claims, 4 Drawing Sheets

ULTRA-THIN GATE DIELECTRICS

FIELD OF THE INVENTION

The present invention relates to microelectronic device fabrication and, more particularly, to gate dielectrics for semiconductor devices.

BACKGROUND OF INVENTION

In the fabrication of semiconductor devices, the semiconductor substrate undergoes a number of thermal processes some of which are performed in two separate apparatus. Batch furnaces, such as vertical diffusion furnaces (VDF), are capable of processing 100–200 substrate simultaneously and are used predominantly for well drive-ins, field oxidation, and gate oxidation of films thicker than about 100 nm. Rapid thermal processors (RTPs) process one wafer at a time and are used predominantly for silicidation, nitridation, $SiO_2$ anneals, and gate oxidation for films under 100 nm.

In front-end processing, gate oxidation is usually considered the most critical oxidation application, as required gate oxide thickness' shrink from 40–50 nm for the 0.25 $\mu$m devices to 30–40 nm for 0.18 $\mu$m devices and 20–30 nm for 0.15 $\mu$m devices. Due to currently available batch furnace limitations, RTPs are used for the ultra-thin, below 100 nm, dielectric gate oxidation and nitridation.

Incorporating nitrogen into the gate oxide, known as nitridation, is an important step in fabrication of an ultra-thin gate dielectric. The incorporation of nitrogen degrades low-field electron mobility, increases high-field electron mobility, improves charge to breakdown, and increases fixed positive charge, among others.

Rapid thermal processors provide dedicated equipment that can provide the precise level of process control required for ultra-thin gate oxidation layers, and in particular, nitridation of the gate oxide. Rapid thermal processors provide faster temperature rise times and more precise temperature uniformity than batch furnaces, which provides the necessary control.

In order to increase through-put and reduce operating times and costs, it is desired to provide gate oxidation and nitridation in-situ and in sequence with other processes using the batch furnace. There is potential to reduce the number of thermal cycles, processing steps, and the cost of equipment if gate oxidation and nitridation can be performed in the batch furnace.

New apparatus and methods are needed for providing an ultra-thin nitrided gate dielectric in an in-situ process using a batch process.

DESCRIPTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

In the following methods, in accordance with embodiments of the present invention, ammonia ($NH_3$) is used as the nitrogen (N) source in in-situ processes for the nitridation of ultra-thin chemically tailored gate dielectrics.

Figures 1A, 1B, 1C:
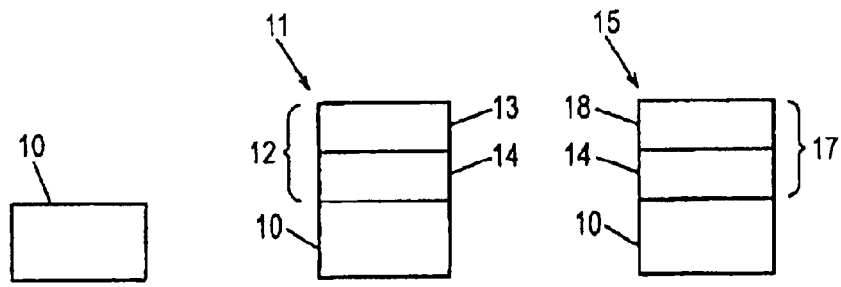
FIGS. 1A–C are side views of a Si substrate 10 undergoing in-situ ammonia nitridation of an ultra-thin DCE/$O_2$ (Trans 1,2-Dichloroethylene) based gate dielectric, in an embodiment in accordance with the invention.

FIGS. 1A–C are side views of a Si substrate 10 undergoing in-situ ammonia nitridation of an ultra-thin DCE/$O_2$ (Trans 1,2-Dichloroethylene) based gate dielectric, in an embodiment in accordance with the invention.

FIG. 1A is a side view of a Si semiconductor substrate 10. The substrate 10 is processed in a batch vertical diffusion furnace with DCE/$O_2$ (Trans 1,2-Dichloroethylene/Oxygen) gas. FIG. 1B is a side view of the resulting substrate 11 showing a base gate dielectric 12 comprising a chlorine (Cl) layer 13 on a silicon dioxide ($SiO_2$) layer 14. The substrate 11 is processed in-situ with an ultra-dilute $NH_3$/$N_2$ gas at a concentration of less than 1E-7 moles $NH_3$/mm$^2$. FIG. 1C is a side view of the resulting substrate 15 showing a dielectric 17 comprising an N layer 18 on the $SiO_2$ layer 14.

The DCE plays a critical role in the in-situ surface nitridation process as the incorporated Cl species is constrained to the surface of the grown gate oxide and undergoes a substitutional chemical reaction with the $NH_3$ species during the nitridation process. The substitutional chemistry between the Cl and $NH_3$ species enables maximum nitrogen incorporation, constraining the nitridation to the surface of the gate dielectric.

FIGS. 2A–D are side views of a Si substrate 10 undergoing in-situ ammonia nitridation of an ultra-thin nitric oxide (NO) based gate dielectric, in an embodiment in accordance with the invention.

Figures 2A, 2B, 2C, 2D:
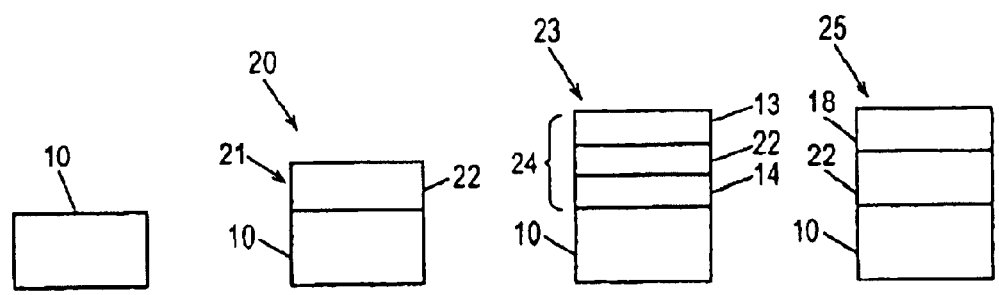
FIGS. 2A–D are side views of a Si substrate 10 undergoing in-situ ammonia nitridation of an ultra-thin nitric oxide (NO) based gate dielectric, in an embodiment in accordance with the invention.

FIG. 2A is a side view of a Si semiconductor substrate 10. The substrate 10 is processed in a batch vertical diffusion furnace with NO/$N_2$ gas. FIG. 2B is a side view of the resulting substrate 20 showing a base gate dielectric 21 comprising a SiON layer 22. The substrate 20 is re-oxidized in-situ with DCE/$O_2$ gas. FIG. 2C is a side view of the resulting substrate 23 showing a dielectric 24 comprising a Cl layer 13 on a SiON layer 22 on a $SiO_2$ layer 14. The substrate 23 is processed in-situ with an ultra-dilute $NH_3$/$N_2$ gas at a concentration of less than 1E-7 moles $NH_3$/mm$^2$. FIG. 2D is a side view of the resulting substrate 26 showing a dielectric 26 comprising an N layer 18 on a SiON layer 22.

The DCE plays a critical role in the in-situ surface nitridation process as the incorporated Cl species is constrained to the surface of the grown gate oxide and undergoes a substitutional chemical reaction with the $NH_3$ species during the nitridation process. The substitutional chemistry between the Cl and $NH_3$ species enables maximum nitrogen incorporation, constraining the nitridation to the surface of the gate dielectric.

FIGS. 3A–D are side views of a Si substrate 10 undergoing in-situ ammonia nitridation of an ultra-thin "dry-wet" $DCE/O_2$—$H_2O/O_2$ based ultra-thin gate dielectric, in an embodiment in accordance with the invention.

Figures 3A, 3B, 3C, 3D:
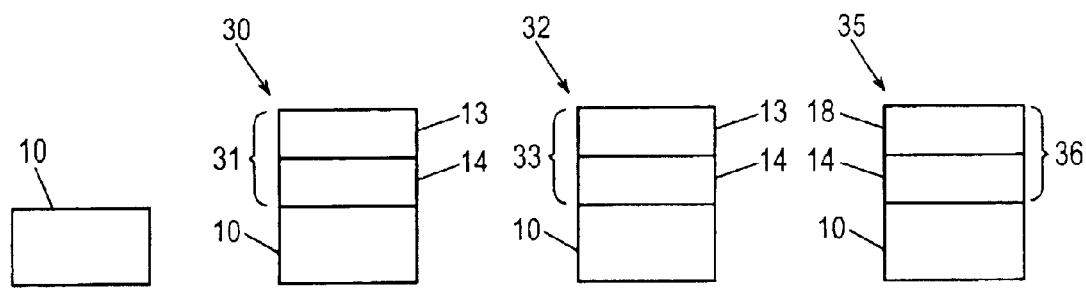
FIGS. 3A–D are side views of a Si substrate 10 undergoing in-situ ammonia nitridation of an ultra-thin "dry-wet" DCE/$O_2$—$H_2O$/$O_2$ based ultra-thin gate dielectric, in an embodiment in accordance with the invention.

FIG. 3A is a side view of a Si semiconductor substrate 10. The substrate 10 is processed in a batch vertical diffusion furnace with a "dry ox" $DCE/O_2$ gas. FIG. 3B is a side view of the resulting substrate 30 showing a base gate dielectric 31 comprising a Cl layer 13 on the $SiO_2$ layer 14. The substrate 30 is processed in-situ with $H_2O/O_2$ gas (wet ox). FIG. 3C is a side view of the resulting substrate 32 showing a dielectric 33 comprising a Cl layer 13 on a $SiO_2$ layer 14. The substrate 32 is processed in-situ with an ultra-dilute $NH_3/N_2$ gas at a concentration of less than 1E-7 moles $NH_3/mm^2$. FIG. 3D is a side view of the resulting substrate 35 showing a dielectric 36 comprising an N layer 18 on a $SiO_2$ layer 14.

The DCE plays a critical role in the in-situ surface nitridation process as the incorporated Cl species is constrained to the surface of the grown gate oxide and undergoes a substitutional chemical reaction with the $NH_3$ species during the nitridation process. The substitutional chemistry between the $C_1$ and $NH_3$ species enables maximum nitrogen incorporation, constraining the nitridation to the surface of the gate dielectric.

FIGS. 4A–D are side views of a Si substrate 10 undergoing in-situ ammonia nitridation of an ultra-thin "dry-wet" $DCE/O_2$—$H_2O/O_2$ based ultra-thin gate dielectric, in another embodiment in accordance with the invention.

Figures 4A, 4B, 4C, 4D:
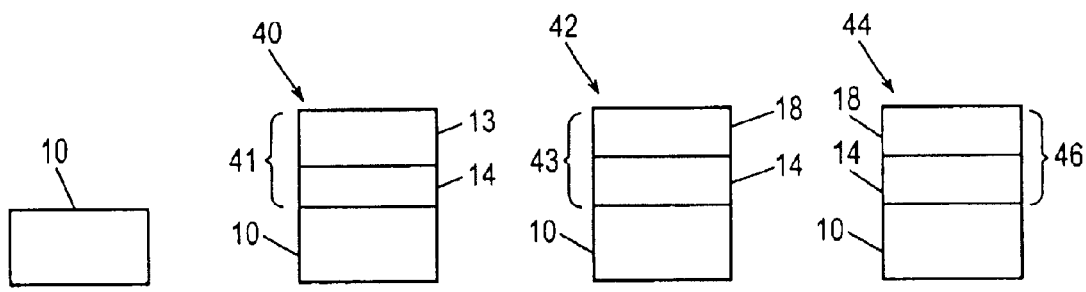
FIGS. 4A–D are side views of a Si substrate 10 undergoing in-situ ammonia nitridation of an ultra-thin "dry-wet" DCE/$O_2$—$H_2O$/$O_2$ based ultra-thin gate dielectric, in another embodiment in accordance with the invention.

FIG. 4A is a side view of a Si semiconductor substrate 10. The substrate 10 is processed in a batch vertical diffusion furnace with a "dry ox" $DCE/O_2$ gas. FIG. 4B is a side view of the resulting substrate 40 showing a base gate dielectric 41 comprising a Cl layer 13 on a $SiO_2$ layer 14. The substrate 40 is processed in-situ with an ultra-dilute $NH_3/N_2$ gas at a concentration of less than 1 E-7 moles $NH_3/mm^2$. FIG. 4C is a side view of the resulting substrate 42 showing a dielectric 43 comprising an N layer 18 on a $SiO_2$ layer 14. The substrate 42 is processed in-situ with $H_2O/O_2$ gas (wet ox). FIG. 4D is a side view of the resulting substrate 44 showing a dielectric 46 comprising an N layer 18 on a $SiO_2$ layer 14.

By changing the specific processing order of the "dry", "wet" and in-situ ammonia nitridation, a gate dielectric can be chemically tailored to incorporate different levels of nitridation at the gate dielectric surface, and alter the edge to area leakage characteristics to accommodate different CMOS technology transistor requirements.

Figure 5:
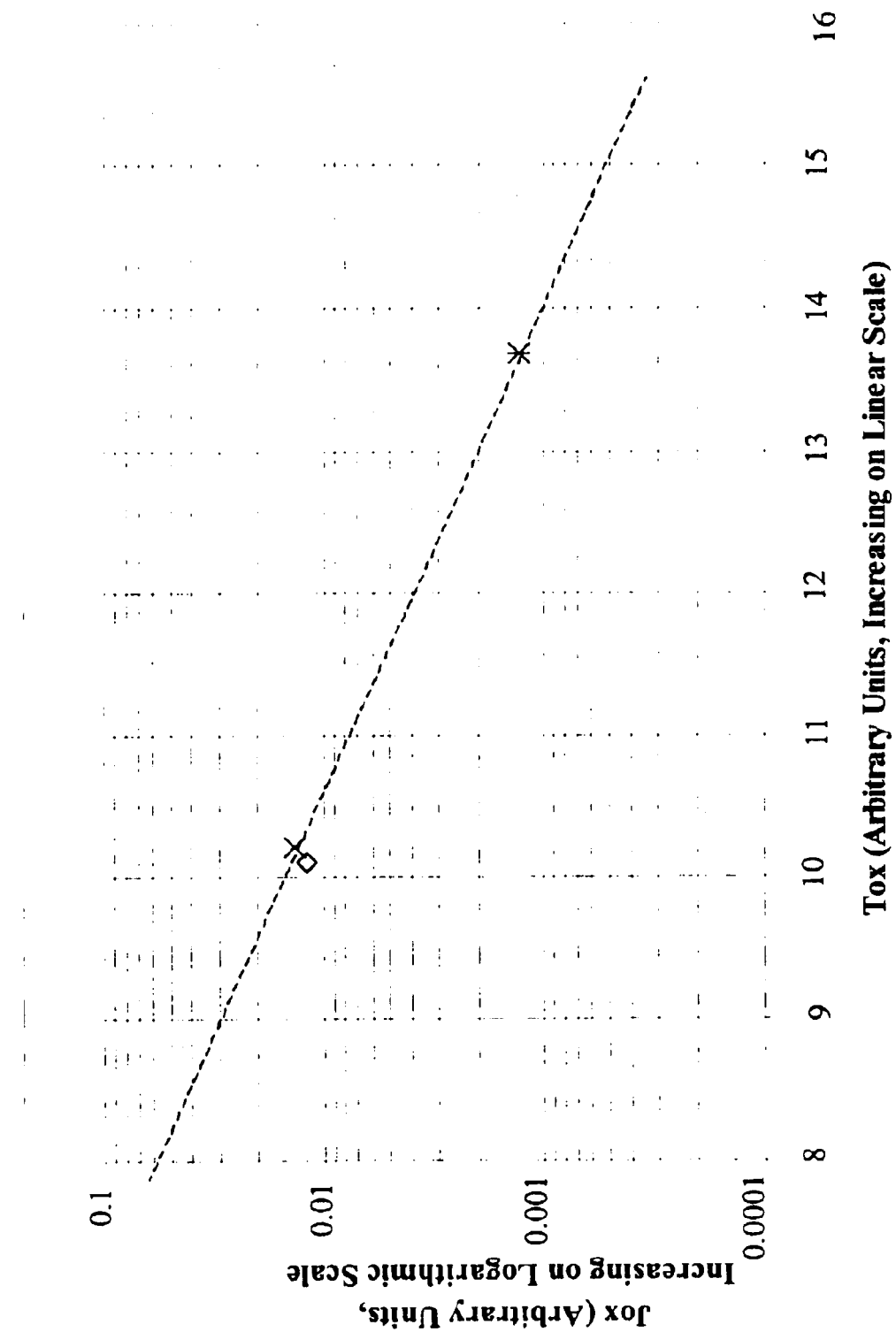
FIG. 5 presents data comparing the performance of an ultra-thin DCE based gate oxide in-situ nitridation in accordance with an embodiment of the present invention with the performance of traditional ex-situ rapid thermal anneal processing.

FIG. 5 present data comparing the performance of an ultra-thin DCE based gate oxide with in-situ nitridation with the performance of traditional ex-situ rapid thermal anneal (RTA) processing for both 13 $\mu$m and 0.09 $\mu$m technologies. The ultra-thin chemically tailored gate dielectrics generated in vertical diffusion furnace with ultra-dilute $NH_3$, below 1E-7 moles $NH_3/mm^2$, in-situ nitridation show a performance comparable or better to traditional ex-situ rapid thermal anneal (RTA) processing techniques for 90 nm CMOS technology. These methods, in accordance with embodiments of the present invention, replace and remove at least one process layer in the fabrication of CMOS devices using traditional ex-situ RTA processing, decreasing production costs, and improving fabrication cycle time, with equivalent or improved transistor performance.

Figure 6:
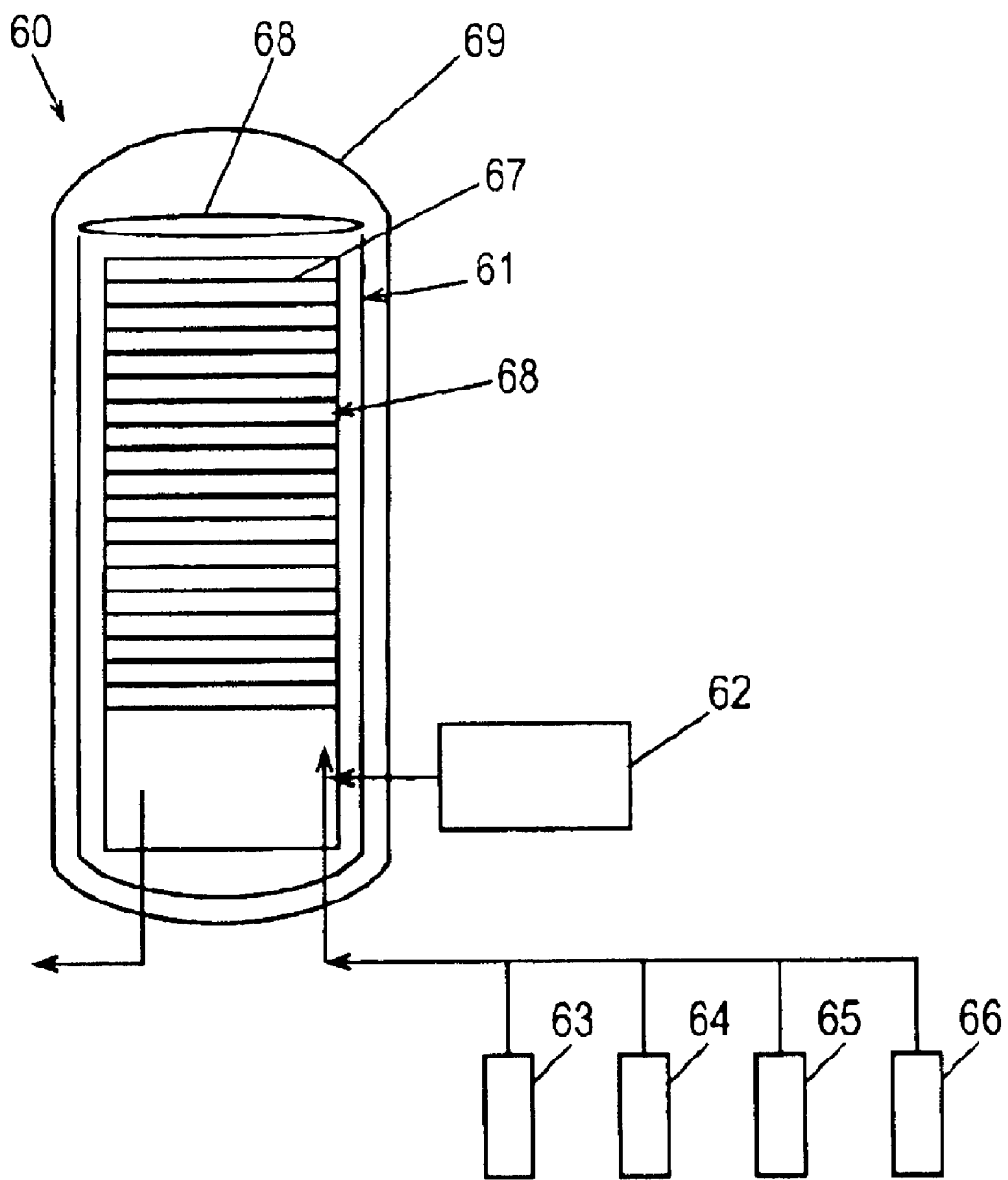
FIG. 6 is a cut-away view of an embodiment of a vertical diffusion furnace in accordance with the present invention.

FIG. 6 is a representation of a vertical diffusion furnace 60 (VDF) for in-situ nitridation and growth of ultra-thin gate dielectrics, in accordance with an embodiment of the present invention. The VDF is particularly useful for nitridation via an $NH_3$ (ammonia) or NO (Nitric Oxide) source. The VDF comprises: a RHC (rapid heat/rapid cool) thermal apparatus 61; an external pyro torch for DCE cracking 62; catalytic water (steam) vapor generator 63; NO (nitric oxide) source 64; $NH_3$ (ammonia) source 65; and $N_2$ reactor chamber dilution source. The semiconductor substrate are held horizontally in a frame 68, and are processed in a reaction chamber 69.

In an embodiment in accordance with the present invention, the VDF 60 comprises: an NO (nitric oxide) source 64 with a flow rate of less than 50 sccms; $NH_3$ (ammonia) source 65 with a flow rate of less than 50 sccms; and $N_2$ reactor chamber dilution source greater than 25 slm. These process flows are necessary to create the ultra-thin processing conditions for ultra-thin in-situ gate dielectric formation, capable of meeting 90 nm CMOS technology requirements.

In an embodiment in accordance with the present invention, the VDF 60 is an atmospheric system capable of processing multiple substrates 67 (batch) with rapid heating and cooling up to temperatures of 1100° C. The substrates 67 are inserted into the reactor chamber 69 where they are oxidized at temperatures between 500° C.–750° C. Subsequently, the oxidized or re-oxidized substrates 67 are thermally ramped to temperatures between 700° C.–975° C. and annealed in-situ with an ultra-dilute $NH_3/N_2$ gas at a concentration of less than 1E-7 moles $NH_3/mm^2$. The substrates 67 are cooled using a rapid heat/rapid cool thermal apparatus to a temperature below 700° C. where the final $NH_3/O_2$ gas (wet ox) treatment is conducted. The substrates 67 are removed from the reactor chamber 69 at a temperature below 700° C. All processing steps occur under atmospheric conditions, in accordance with the methods of the present invention.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method for ammonia nitridation of an ultra-thin $DCE/O_2$ (Trans 1,2-Dichloroethylene) based gate dielectric comprising:

providing a base gate dielectric comprising a chlorine (Cl) layer on a silicon dioxide ($SiO_2$) layer on a Si substrate; and processing the Si substrate with an ultra-dilute $NH_3/N_2$ gas at a concentration of less than 1E-7 moles $NH_3$/ mm² forming a dielectric comprising an N layer on the SiO₂ layer on the Si substrate.

2. The method of claim 1, wherein processing the Si substrate comprises processing the Si substrate in a batch vertical diffusion furnace.

3. The method of claim 1, wherein processing the Si substrate with an ultra-dilute $NH_3/N^2$ gas at a concentration of less than 1E-7 moles $NH_3/mm^2$ comprises:

processing the Si substrate in a batch vertical diffusion furnace processed in-situ with an ultra-dilute $NH_3/N_2$ gas at a concentration of less than 1 E-7 moles $NH_3/mm^2$.

4. The method of claim 1, wherein providing a base gate dielectric comprises forming the base gate dielectric by processing a Si substrate in a furnace with DCE/O₂ (Trans 1,2-Dichloroethylene/Oxygen ) gas.

5. The method of claim 4, further comprising prior to processing the Si substrate in a furnace with DCE/O₂ (Trans 1,2-Dichloroethylene/Oxygen) gas forming a base gate dielectric comprising a chlorine (Cl) layer on a silicon dioxide (SiO₂) layer on the Si substrate:

annealing at a temperature less than 1000° C. at atmospheric pressure.

6. A method for ammonia nitridation of an ultra-thin nitric oxide (NO) based gate dielectric, comprising:

providing a dielectric comprising a Cl layer on a SiON layer on a SiO₂ layer on a Si substrate; and processing the Si substrate with an ultra-dilute $NH_3/N_2$ gas forming a dielectric comprising an N layer on a SiON layer on the Si substrate.

7. The method of claim 6, wherein the Si substrate is processed in a batch vertical diffusion furnace.

8. The method of claim 6, wherein providing of a dielectric comprises forming the dielectric by processing a Si substrate in a furnace with NO/N₂ gas forming a base gate dielectric comprising a SiON layer on the substrate; and re-oxidizing the Si substrate with DE/O₂ gas forming the dielectric comprising the Cl layer on the SiON layer on the SiO₂ layer on the Si substrate.

9. The method of claim 8, wherein re-oxidizing the Si substrate with DCE/O₂ gas comprises re-oxidizing the Si substrate in-situ with DCE/O₂ gas.

10. The method of claim 8, further comprising prior to processing the Si substrate in a furnace with DCE/O₂ (Trans 1,2-Dichloroethylene/Oxygen) gas forming a base gate dielectric comprising a chlorine (Cl) layer on a silicon dioxide (SiO₂) layer on the Si substrate:

annealing at a temperature less than 1000° C. at atmospheric pressure.

11. The method of claim 6, wherein processing the Si substrate with an ultra-dilute $NH_3/N_2$ gas comprises:

processing the Si substrate with an ultra-dilute $NH_3/N_2$ gas at a concentration of less than 1E-7 moles $NH_3/mm^2$.

12. The method of claim 11, wherein processing the Si substrate with an ultra-dilute $NH_3/N_2$ gas at a concentration of less than 1E-7 moles $NH_3/mm^2$ comprises:

processing the Si substrate in a batch vertical diffusion furnace processed in-situ with an ultra-dilute $NH_3/N_2$ gas at a concentration of less than 1 E-7 moles $NH_3/mm^2$.

13. A method for ammonia nitridation of an ultra-thin "dry-wet" DCE/O₂—H₂O/O₂ based gate dielectric, comprising:

processing a Si substrate in a furnace with a "dry ox" DCE/O₂ gas forming a base gate dielectric comprising a Cl layer on the SiO₂ layer on the Si substrate;

processing the substrate with H₂O/O₂ gas (wet ox) forming a dielectric comprising a Cl layer on a SiO₂ layer on the Si substrate; and processing the Si substrate with an ultra-dilute $NH_3/N_2$ gas forming a dielectric comprising an N layer on a SiO₂ layer on the Si substrate.

14. The method of claim 13, wherein the processing of the Si substrate with an ultra-dilute $NH_3/N_2$ gas is in a batch vertical diffusion furnace.

15. The method of claim 14, wherein processing the Si substrate with an ultra-dilute $NH_3/N_2$ gas comprises:

processing the Si substrate with an ultra-dilute $NH_3/N_2$ gas at a concentration of less than 1E-7 moles $NH_3/mm^2$.

16. The method of claim 13, further comprising prior to processing the Si substrate in a furnace with DCE/O₂ (Trans 1,2-Dichloroethylene/Oxygen) gas forming a base gate dielectric comprising a chlorine (Cl) layer on a silicon dioxide (SiO₂) layer on the Si substrate:

annealing at a temperature less than 1000° C. at atmospheric pressure.

17. A method for ammonia nitridation of an ultra-thin "dry-wet" DCE/O₂—H₂O/O₂ based ultra-thin gate dielectric, comprising:

providing a base gate dielectric comprising a Cl layer on a SiO₂ layer on Si substrate;

processing the Si substrate with an ultra-dilute $NH_3/N_2$ gas forming a dielectric comprising an N layer on a SiO₂ layer on the Si substrate; and processing the Si substrate with H₂O/O₂ gas (wet ox) forming a dielectric comprising an N layer on a SiO₂ layer.

18. The method of claim 17, wherein the processing of the Si substrate with an ultra-dilute $NH_3/N_2$ gas is in a batch vertical diffusion furnace.

19. The method of claim 18, wherein the processing of the Si substrate with an ultra-dilute $NH_3/N_2$ gas comprises:

processing the Si substrate with an ultra-dilute $NH_3/N_2$ gas at a concentration of less than 1E-7 moles $NH_3/mm^2$.

20. The method of claim 19, wherein the processing of the Si substrate with an ultra-dilute $NH_3/N_2$ gas at a concentration of less than 1E-7 moles $NH_3/mm^2$ comprises:

processing the Si substrate in a batch vertical diffusion furnace processed in-situ with an ultra-dilute $NH_3/N_2$ gas at a concentration of less than 1 E-7 moles $NH_3/mm^2$.

21. The method of claim 17, wherein providing a base gate dielectric comprises forming the dielectric by processing a Si substrate in a furnace with a "dry ox" DCE/)₂ gas.

22. The method of claim 21, further comprising prior to processing the Si substrate in a furnace with a "dry ox" DCE/O₂ gas forming a base gate dielectric comprising a Cl layer on a SiO₂ layer on the Si substrate:

annealing at a temperature lass than 1000° C. at atmospheric pressure.

* * * * *

UNITED STATES PATENT AND TRADEMARK OFFICE
CERTIFICATE OF CORRECTION

PATENT NO. : 6,808,993 B2
DATED : October 26, 2004
INVENTOR(S) : Finnie et al.

It is certified that error appears in the above-identified patent and that said Letters Patent is hereby corrected as shown below:

Column 5,
Line 7, "...NH3/N2 gas..." should read -- .$NH_3/N_2$ gas... --;
Line 11, "...1 E-7 moles..." should read -- 1E-7 moles... --;
Lines 26-27, "providing [new paragraph] a dielectric..." should read -- providing a dielectric... --;
Line 39, "...DE/O2 gas..." should read -- ...DCE/O2 gas... --;

Column 6,
Line 56, "...DCE/)2 gas." should read -- ...DCE/O2 gas. --; and
Line 61, "...lass than..." should read -- ...less than... --.

Signed and Sealed this

Fourteenth Day of February, 2006

JON W. DUDAS
*Director of the United States Patent and Trademark Office*